United States Patent
Fan (10) Patent No.: US 12,176,311 B2
(45) Date of Patent: Dec. 24, 2024

(54) MICRO BUMP, METHOD FOR FORMING MICRO BUMP, CHIP INTERCONNECTION STRUCTURE AND CHIP INTERCONNECTION METHOD

(71) Applicant: CHANGXIN MEMORY TECHNOLOGIES, INC., Hefei (CN)

(72) Inventor: Zengyan Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 330 days.

(21) Appl. No.: 17/650,844

(22) Filed: Feb. 12, 2022

(65) Prior Publication Data
US 2023/0005869 A1    Jan. 5, 2023

Related U.S. Application Data (63) Continuation of application No. PCT/CN2021/117234, filed on Sep. 8, 2021.

(30) Foreign Application Priority Data

Jul. 5, 2021    (CN) .......................... 202110756416.6

(51) Int. Cl.
*H01L 21/00*    (2006.01)
*H01L 21/768*    (2006.01)
(Continued)

(52) U.S. Cl.
CPC ........ *H01L 24/11* (2013.01); *H01L 21/76831* (2013.01); *H01L 21/76843* (2013.01);
(Continued)

(58) Field of Classification Search
CPC .............. H01L 24/11; H01L 21/76831; H01L 21/76843
See application file for complete search history.

(56) References Cited

U.S. PATENT DOCUMENTS 8,039,385 B1 * 10/2011 West ...................... H01L 24/13
257/E23.033
8,222,748 B2 * 7/2012 Gallegos ............... H01L 23/295
257/E23.021
(Continued)

FOREIGN PATENT DOCUMENTS

CN    101877336 A  * 11/2010  ......... H01L 21/6836
CN    102157459 B     8/2012
(Continued)

*Primary Examiner* — Laura M Menz
(74) *Attorney, Agent, or Firm* — Syncoda LLC; Feng Ma (57) ABSTRACT

A method for forming a micro bump includes the following operations. A chip at least including a silicon substrate and a Through Silicon Via (TSV) penetrating through the silicon substrate is provided. A conductive layer having a first preset size in a first direction is formed in the TSV, the first direction being a thickness direction of the silicon substrate. A connecting layer having a second preset size in the first direction is formed on a surface of the conductive layer in the TSV, where a sum of the first preset size and the second preset size is equal to an initial size of the TSV in the first direction. The silicon substrate is processed to expose the connecting layer, for forming a micro bump corresponding to the TSV.

13 Claims, 10 Drawing Sheets

(51) Int. Cl.
*H01L 23/00* (2006.01)
*H01L 23/48* (2006.01)
*H01L 25/065* (2023.01)

(52) U.S. Cl.
CPC ...... *H01L 21/76898* (2013.01); *H01L 23/481* (2013.01); *H01L 24/13* (2013.01); *H01L 24/16* (2013.01); *H01L 25/0657* (2013.01); *H01L 2224/113* (2013.01); *H01L 2224/11616* (2013.01); *H01L 2224/13144* (2013.01); *H01L 2224/13155* (2013.01); *H01L 2224/16146* (2013.01); *H01L 2225/06513* (2013.01); *H01L 2924/014* (2013.01)

(56) References Cited

U.S. PATENT DOCUMENTS

| | | | |
|---|---|---|---|
| 8,456,017 B2 * | 6/2013 | Dai | H01L 25/0657 257/737 |
| 9,478,509 B2 * | 10/2016 | Filippi | H01L 24/13 |
| 9,716,066 B2 * | 7/2017 | Lee | H01L 23/564 |
| 9,786,605 B1 * | 10/2017 | Edelstein | H01L 21/76856 |
| 2010/0096738 A1 * | 4/2010 | Simmons-Matthews | H01L 23/5384 257/737 |
| 2010/0301493 A1 * | 12/2010 | Gallegos | H01L 21/563 257/784 |
| 2011/0079916 A1 * | 4/2011 | West | H01L 23/49811 257/774 |
| 2012/0175774 A1 * | 7/2012 | West | H01L 23/3128 438/653 |
| 2012/0252170 A1 * | 10/2012 | Gallegos | H01L 24/13 257/E21.502 |
| 2013/0062736 A1 * | 3/2013 | Brighton | H01L 21/76897 438/653 |
| 2013/0099384 A1 * | 4/2013 | Simmons-Matthews | H01L 23/481 257/772 |
| 2014/0084375 A1 * | 3/2014 | Lee | H01L 23/522 257/621 |
| 2014/0322909 A1 * | 10/2014 | Chen | H01L 21/76898 438/613 |
| 2015/0064899 A1 * | 3/2015 | Ji | H01L 21/6835 438/614 |
| 2015/0255410 A1 * | 9/2015 | Filippi | H01L 24/03 257/774 |
| 2017/0345737 A1 * | 11/2017 | Edelstein | H01L 21/2885 |
| 2019/0067228 A1 * | 2/2019 | Son | H01L 24/81 |
| 2020/0350284 A1 * | 11/2020 | Shih | H01L 25/0657 |
| 2021/0125966 A1 * | 4/2021 | Shih | H01L 24/19 |
| 2022/0052008 A1 * | 2/2022 | Fan | H01L 24/11 |
| 2023/0005869 A1 * | 1/2023 | Fan | H01L 21/76898 |
| 2023/0137875 A1 * | 5/2023 | Gao | H01L 24/05 438/107 |
| 2023/0290690 A1 * | 9/2023 | Zhang | H01L 21/76898 |
| 2024/0055399 A1 * | 2/2024 | Lv | H01L 23/5384 |
| 2024/0055420 A1 * | 2/2024 | Lv | H01L 24/11 |
| 2024/0057350 A1 * | 2/2024 | Chuang | H10B 80/00 |
| 2024/0057351 A1 * | 2/2024 | Chuang | H01L 24/08 |
| 2024/0063187 A1 * | 2/2024 | Lv | H01L 25/18 |
| 2024/0071864 A1 * | 2/2024 | Lv | H01L 24/73 |
| 2024/0096700 A1 * | 3/2024 | Fan | H01L 23/481 |
| 2024/0096833 A1 * | 3/2024 | Fang | H01L 24/81 |

FOREIGN PATENT DOCUMENTS

| | | | | |
|---|---|---|---|---|
| CN | 203855403 U | * | 10/2014 | |
| CN | 102937695 B | | 1/2015 | |
| CN | 109755213 A | * | 5/2019 | ......... H01L 21/6835 |
| CN | 115588619 A | * | 1/2023 | ....... H01L 21/76831 |
| WO | WO-2014209404 A1 | * | 12/2014 | ......... H01L 21/6835 |
| WO | WO-2022000436 A1 | * | 1/2022 | ............. B82Y 40/00 |
| WO | WO-2023010259 A1 | * | 2/2023 | ....... H01L 21/76898 |

* cited by examiner

MICRO BUMP, METHOD FOR FORMING MICRO BUMP, CHIP INTERCONNECTION STRUCTURE AND CHIP INTERCONNECTION METHOD

CROSS-REFERENCE TO RELATED APPLICATIONS

This is a continuation of International Patent Application No. PCT/CN2021/117234 filed on Sep. 8, 2021, which claims priority to Chinese Patent Application No. 202110756416.6 filed on Jul. 5, 2021. The disclosures of these applications are hereby incorporated by reference in their entirety.

BACKGROUND

In a semiconductor packaging process, a flip chip bonding process is usually used to bond a chip to a substrate or the chip to the chip. A copper pillar bump is usually used to realize the bonding between the chip and the substrate or the bonding between the chip and the chip. A copper pillar bump technology is a technology to make a welding bump on a surface of the chip, so that the chip has better conductivity, heat conduction and electron migration resistance. The copper pillar bump is adopted for packaging, which not only can shorten the length of a connecting circuit, reduce the chip packaging area and volume, realize miniaturization, but also improve the performance of a chip packaging module.

SUMMARY

The embodiment of the disclosure relates, but is not limited, to a micro bump, a method for forming the micro bump, a chip interconnection structure and chip interconnection method.

According to a first aspect of the embodiment of the disclosure, there is provided a method for forming a micro bump, including the following operations. A chip at least including a silicon substrate and a through silicon via (TSV) penetrating through the silicon substrate is provided. A conductive layer is formed in the through silicon via, where the conductive layer has a first preset size in a first direction, and the first direction is a thickness direction of the silicon substrate. A connecting layer is formed on a surface of the conductive layer in the TSV, where the connecting layer has a second preset size in the first direction, and a sum of the first preset size and the second preset size is equal to an initial size of the TSV in the first direction. The silicon substrate is processed to expose the connecting layer, for forming a micro bump corresponding to the TSV.

According to a second aspect of the embodiment of the disclosure, there is provided a micro bump, which is formed by the method for forming the micro bump above described. The micro bump is located in a TSV structure of a chip, and the micro bump is at least configured to implement an interconnection between two chips.

According to a third aspect of the embodiment of the disclosure, there is provided a chip interconnection method, including the following operations. At least two chips are provided, in which the chip may include a TSV opened from a first surface of the chip and a dielectric layer located on a second surface of the chip, a metal interconnection wire connected with the TSV is formed in the dielectric layer, and the first surface and the second surface are two opposite surfaces of the chip along the thickness direction of the chip. A micro bump located on the first surface of the chip is formed by the method for forming the micro bump above described at a position corresponding to the TSV of the chip. Ball planting is performed on an exposed surface of the metal interconnection wire in the chip to form a bonding bump located on the second surface of the chip. The micro bump on the first surface of a first chip in the at least two chips is aligned and bonded with the welding bump on the second surface of a second chip in the at least two chips to realize an interconnection between the at least two chips through the micro bump.

According to a fourth aspect of the embodiment of the disclosure, there is provided a chip interconnection structure, including: at least two chips, in which the chip may include a TSV opened from a first surface of the chip and a dielectric layer located on a second surface of the chip, a metal interconnection wire connected with the TSV is formed in the dielectric layer, and the first surface and the second surface are two opposite surfaces of the chip along the thickness direction of the chip; a micro bump located on the first surface of the chip, in which the micro bump is connected with the TSV and the micro bump is formed by the method for forming the micro bump above described; a bonding bump located on the second surface of the chip, in which the bonding bump is connected with the metal interconnection wire. The micro bump on the first surface of a first chip in the at least two chips is electrically connected with the welding bump on the second surface of a second chip in the at least two chips.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The drawings generally illustrate the various embodiments discussed herein by way of examples rather than limitation.

DETAILED DESCRIPTION

The specific technical solutions of the disclosure will be further described in detail below in combination with the drawings in the embodiment of the disclosure. The following embodiments are used to illustrate the disclosure, but are not used to limit the scope of the disclosure.

In the subsequent description, suffixes such as "module" or "unit" used to represent elements are used only to facilitate the description of the disclosure, which have no specific meaning in themselves. Therefore, "module" or "unit" can be used in a mixed manner.

With the continuous increase of chip integration, the pitch between adjacent bumps is also becoming smaller and smaller. The copper pillar bump technology may not meet the requirements of small pitch and small size due to its own process limitations.

Before a micro bump in the embodiment of the disclosure is described, a copper pillar bump in some implementations is introduced at first.

Figure 1:
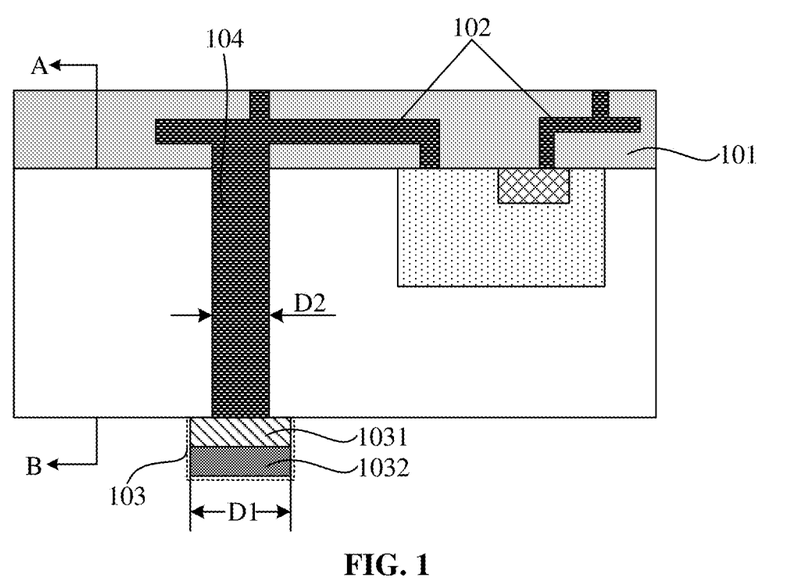
FIG. 1 is a schematic section structural diagram of a chip packaged with a TSV technology in some implementations.

In the some implementations, the copper pillar bump is usually used to realize the bonding between a chip and a substrate or the bonding between the chip and the chip. FIG. 1 is a schematic section structural diagram of a chip packaged with a TSV technology in some implementations. As illustrated in FIG. 1, a metal interconnection wire 102 located in a dielectric layer 101 is formed on a first surface of the chip (such as a surface A illustrated in FIG. 1), and the metal interconnection wire 102 is configured to lead out a signal of the first surface of the chip; a copper pillar bump 103 is formed on a second surface of the chip (such as a surface B illustrated in FIG. 1), the copper pillar bump 103 is formed by two parts including a copper pillar 1031 and a tin block 1032 for welding, and the position of the copper pillar bump 103 corresponds to the position of a through silicon via (TSV) 104 in the chip. It can be seen from FIG. 1 that, the size D1 of the copper column bump in the some implementations is greater than the size D2 of the TSV.

With the continuous increase of chip integration, the pitch between adjacent bumps is also becoming smaller and smaller. However, the size of the copper pillar bump formed in some implementations is relatively large, and it is impossible to achieve the pitch between the bumps less than 20 microns. Therefore, it may not meet the requirements for the micro bump with small pitch and small size in a current chip stacking technology.

Figure 2:
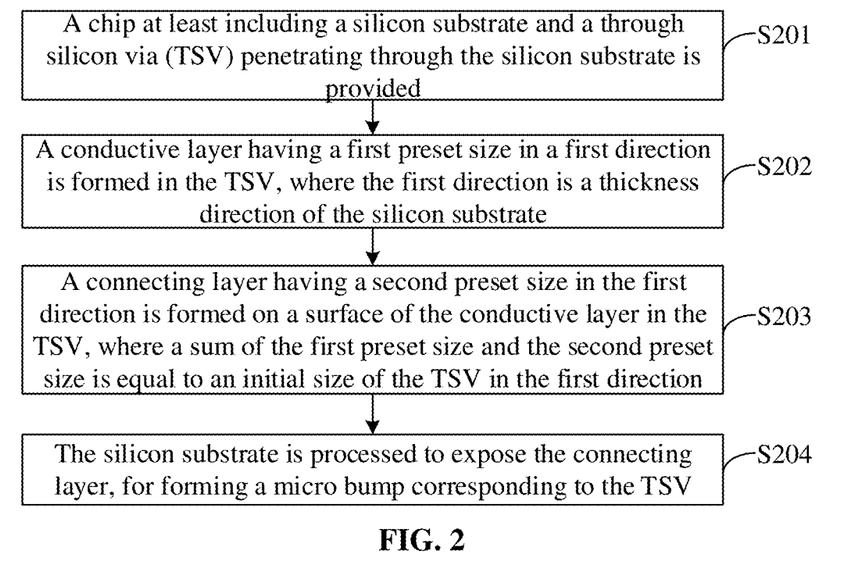
FIG. 2 is an optional schematic flowchart of a method for forming a micro bump provided in an embodiment of the disclosure.

Based on the above problems in the some implementations, the embodiment of the disclosure provides a method for forming a micro bump. Usually, the chip transmits a signal from the front of the chip to the back of the chip through a TSV technology, and the direct stacking between chips needs an interconnection through micro bumps. FIG. 2 is an optional schematic flowchart of a method for forming a micro bump provided in an embodiment of the disclosure. As illustrated in FIG. 2, the method may include the following steps.

At S201, a chip at least including a silicon substrate and a TSV penetrating through the silicon substrate is provided.

Various active devices and circuits are formed in the chip to realize various functions. In the embodiment of the disclosure, the chip at least includes a silicon substrate.

The TSV is a through hole formed in the chip and penetrating through the silicon substrate of the chip. The TSV is filled with a conductive material to transmit a signal from the front of the chip to the back of the chip.

The silicon substrate may include a top surface located on the front and a bottom surface located on the back opposite to the front. In the case of ignoring the flatness of the top surface and the bottom surface of the silicon substrate, a direction perpendicular to the top surface and the bottom surface of the silicon substrate, namely a thickness direction of the silicon substrate, is defined as a first direction. In the top surface and the bottom surface of the silicon substrate (i.e., a plane where the silicon substrate is located), any direction is defined as a second direction. Here, the first direction is perpendicular to the second direction. In the embodiment of the disclosure, the first direction is defined as the X-axis direction, and the second direction is defined as the Y-axis direction.

At S202, a conductive layer is formed in the TSV.

The conductive layer has a first preset size in a first direction, and the first direction is the thickness direction of the silicon substrate.

In some embodiments, a conductive material of the conductive layer may be metallic copper or metallic tungsten.

In other embodiments, before the conductive layer is formed in the TSV, an insulating layer, a barrier layer and a seed layer may be formed in the TSV. The material of the insulating layer may be $SiO_2$, the material of the barrier layer may be metallic tantalum or tantalum nitride, and the material of the seed layer may be metallic tungsten, cobalt, copper, aluminum or any combination thereof.

At S203, a connecting layer is formed on a surface of the conductive layer in the TSV.

The connecting layer has a second preset size in the first direction, and a sum of the first preset size and the second preset size is equal to an initial size of the TSV in the first direction.

In the embodiment of the disclosure, the connecting layer is configured to form a subsequent micro bump.

At S204, the silicon substrate is processed to expose the connecting layer, for forming a micro bump corresponding to the TSV.

In the embodiment of the disclosure, processing the silicon substrate means etching or thinning the silicon substrate to expose the connecting layer. Here, the silicon substrate may be etched by a dry etching process, which may be a plasma etching process, a reactive ion etching process or an ion milling process.

It is to be noted that, in the embodiment of the disclosure, processing the silicon substrate to expose the connecting layer includes two meanings: one is processing the silicon substrate to completely expose the connecting layer; and the other is processing the silicon substrate to expose a part of the connecting layer.

In the embodiment of the disclosure, forming the micro bump corresponding to the TSV means that: on the one hand, the position of the formed micro bump corresponds to the TSV, that is, a micro bump will be formed at a position corresponding to each TSV; on the other hand, since the micro bump in the embodiment of the disclosure is formed in the TSV, the size of the formed micro bump is less than or equal to the size of the TSV.

According to the method for forming the micro bump provided in the embodiment of the disclosure, since the connecting layer forming the micro bump is formed in the TSV, the micro bump corresponding to the TSV may be formed by removing the silicon substrate and exposing the connecting layer. In this way, the micro bump with small size and small pitch may be manufactured.

FIGS. 3A-3K are schematic flowcharts of forming a micro bump provided in an embodiment of the disclosure. The method for forming the micro bump provided in the embodiment of the disclosure is further described in detail below with reference to FIGS. 3A-3K.

At first, referring to FIGS. 3A-3D, S201 is executed to provide a chip at least including a silicon substrate and a TSV penetrating through the silicon substrate.

In the embodiment of the disclosure, the chip includes a silicon substrate and a TSV opened from a first surface of the silicon substrate, the chip also includes a dielectric layer located on a second surface of the silicon substrate, and a metal interconnection wire connected with the TSV is formed in the dielectric layer. The TSV and the metal interconnection wire are jointly configured to transmit a signal of the first surface of the silicon substrate (i.e., a first surface of the chip) to the second surface of the silicon substrate (i.e., a second surface of the chip), or to transmit a signal of the second surface of the silicon substrate (i.e., the second surface of the chip) to the first surface of the silicon substrate (i.e., the first surface of the chip). The first surface of the silicon substrate and the second surface of the silicon substrate are two opposite surfaces of the silicon substrate in a first direction. The first direction is the thickness direction of the silicon substrate.

In some embodiments, the chip further includes a welding pad located on the second surface of the silicon substrate. A first end of the welding pad is connected with an internal circuit of the chip, and a second end of the welding pad is connected with the metal interconnection wire in the dielectric layer. The metal interconnection wire is also configured to lead out a signal of the second surface of the silicon substrate (i.e., the second surface of the chip).

In some embodiments, the metal interconnection wire located in the dielectric layer is formed in the following manner.

A dielectric material is deposited on the second surface of the silicon substrate to form the dielectric layer.

Here, the dielectric material may be $SiO_2$ or other insulating materials. A process of depositing the dielectric material on the second surface of the silicon substrate may include Chemical Vapor Deposition (CVD), Chemical Vapor Deposition (PVD), or Atomic Layer Deposition (ALD).

A patterned second photoresist layer is formed on a surface of the dielectric layer.

The dielectric layer is etched through the second photoresist layer to form an interconnection hole located in the dielectric layer.

The interconnection hole is filled with a conductive material to form the metal interconnection wire located in the dielectric layer.

In some embodiments, the conductive material includes tungsten (W), cobalt (Co), copper (Cu), aluminum (Al), polysilicon, doped silicon, silicide or any combination thereof.

Figure 3A:
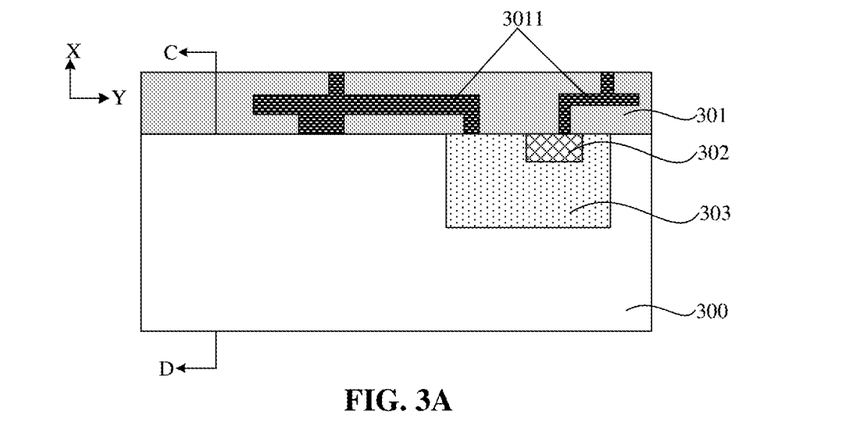
FIG. 3A is a first flowchart of forming a micro bump provided in an embodiment of the disclosure.

In some embodiments, in the process of forming a chip, a dielectric layer and a metal interconnection wire are formed at first, and then a TSV is formed. FIG. 3A is a schematic section structural diagram of forming a dielectric layer and a metal interconnection wire provided in an embodiment of the disclosure. As illustrated in FIG. 3A, a dielectric layer 301 is formed on the second surface of the silicon substrate 300 (such as a surface C illustrated in FIG. 3A), and a metal interconnection wire 3011 is formed in the dielectric layer 301. The chip also includes a welding pad 302 located at the second surface of the silicon substrate. A first end of the welding pad 302 is connected with an internal circuit 303 in the chip, and a second end of the welding pad 302 is connected with the metal interconnection wire 3011 in the dielectric layer 301.

In some embodiments, providing the chip may be implemented through the following steps.

At S2011, the silicon substrate is provided.

At S2012, the silicon substrate is etched by taking the first surface of the silicon substrate as an etching starting point to form the TSV penetrating through the silicon substrate.

In some embodiments, forming the TSV penetrating through the silicon substrate may be implemented through the following steps.

A first photoresist layer is formed on a surface of the silicon substrate.

Herein, the first photoresist layer may be formed on the first surface of the silicon substrate by any proper deposition process.

The first photoresist layer is patterned to form a window exposing the first surface of the silicon substrate.

In some embodiments, the first photoresist layer may be patterned through exposure, development and other steps to form the window.

Figure 3B:
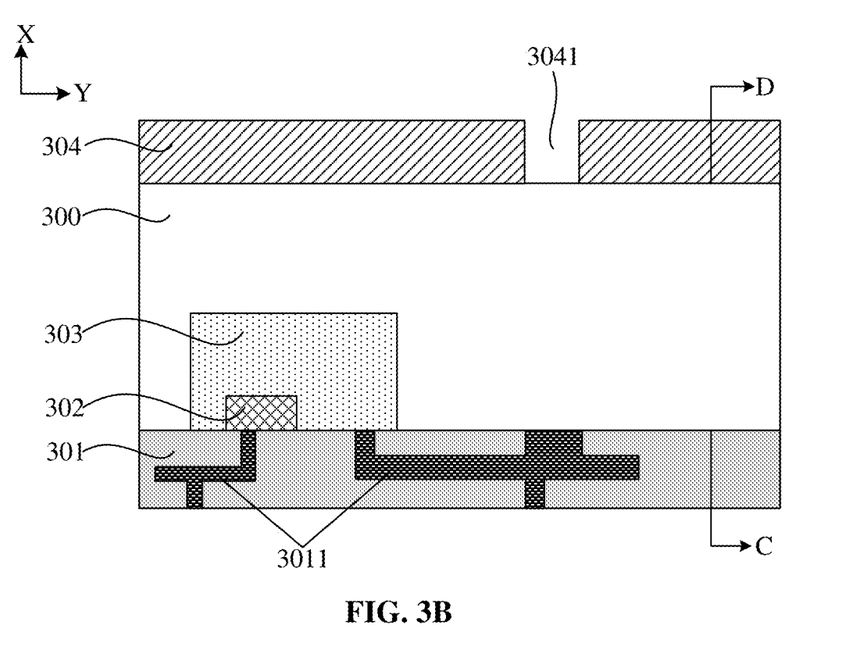
FIG. 3B is a second flowchart of forming a micro bump provided in an embodiment of the disclosure.

As illustrated in FIG. 3B, a first photoresist layer 304 is formed on the first surface of the silicon substrate 300 (such as the surface D in FIG. 3B), and the first photoresist layer 304 is patterned to form a window 3041, which exposes the first surface of the silicon substrate. It is to be noted that, FIG. 3B only exemplarily illustrates that one window is formed in the first photoresist layer, but in the actual process, at least two windows may be formed in the first photoresist layer.

In the embodiment of the disclosure, the size of the formed TSV in the Y-axis direction is less than 15 microns, and the pitch between two adjacent TSVs is less than 20 microns.

The silicon substrate is etched through the window to form the TSV penetrating through the silicon substrate.

Figure 3C:
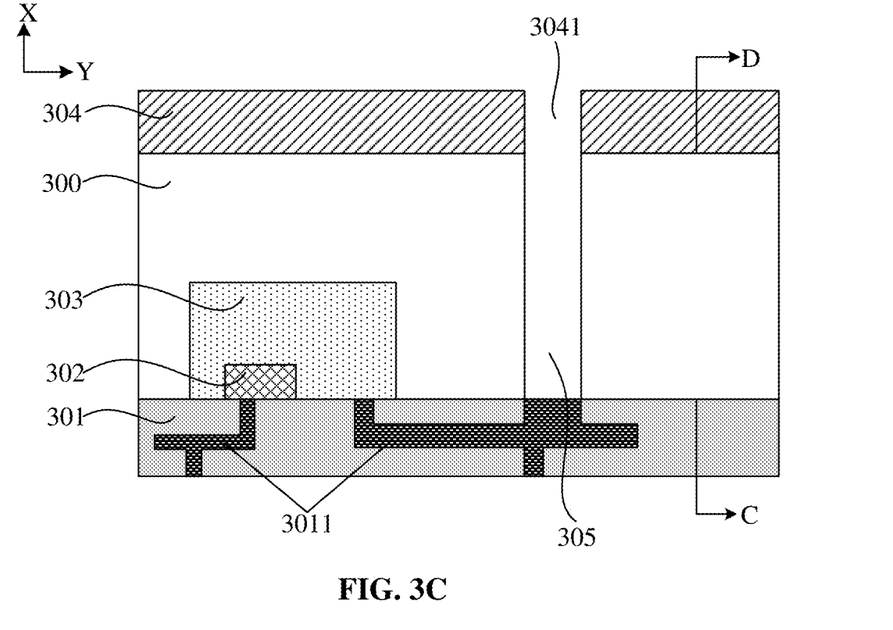
FIG. 3C is a third flowchart of forming a micro bump provided in an embodiment of the disclosure.

As illustrated in FIG. 3C, the silicon substrate 300 is etched through the window 3041 to form the TSV 305 penetrating through the silicon substrate 300. It is to be noted that, FIG. 3C only exemplarily illustrates one TSV, but in the actual process, at least two TSVs may be formed in the chip.

In some embodiments, after the TSV is formed through the window in the first photoresist layer, the method for forming the micro bump further include: removing the first photoresist layer.

Figure 3D:
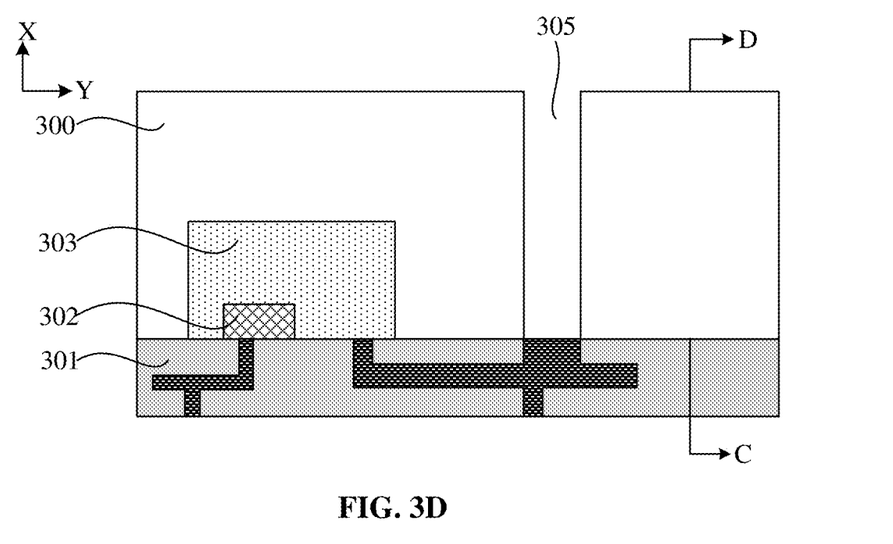
FIG. 3D is a fourth flowchart of forming a micro bump provided in an embodiment of the disclosure.

In the embodiment of the disclosure, the first photoresist layer may be removed by a wet etching process or a dry etching process. As illustrated in FIG. 3D, the first photoresist layer is removed to expose the surface D of the silicon substrate 300.

Figure 3E:
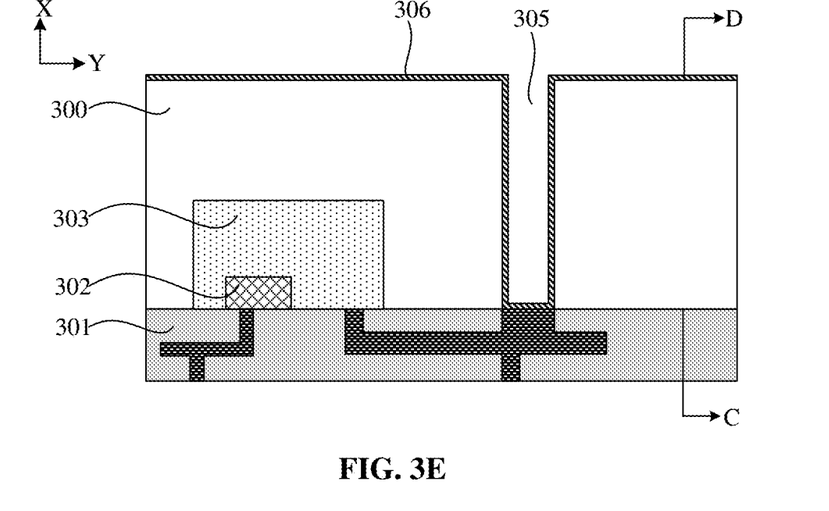
FIG. 3E is a fifth flowchart of forming a micro bump provided in an embodiment of the disclosure.
Figure 3F:
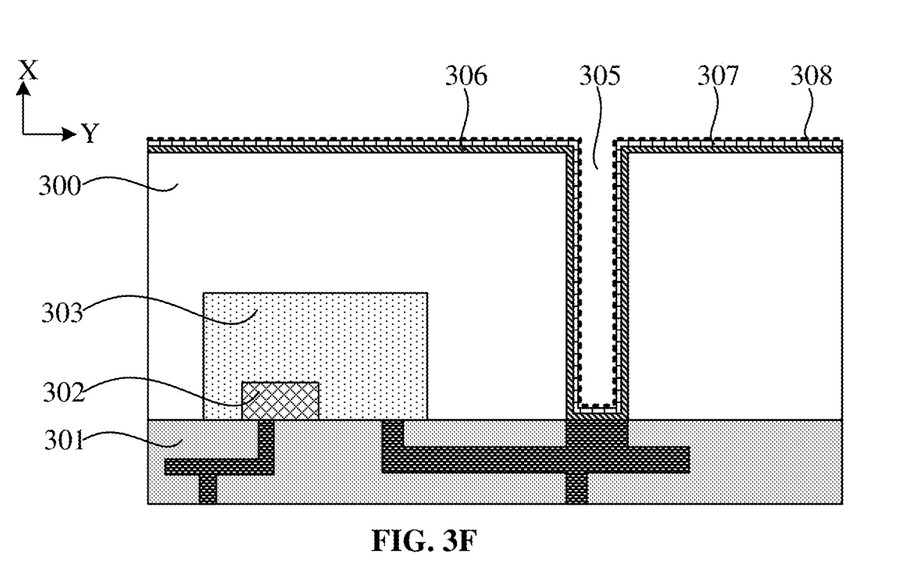
FIG. 3F is a sixth flowchart of forming a micro bump provided in an embodiment of the disclosure.
Figure 3G:
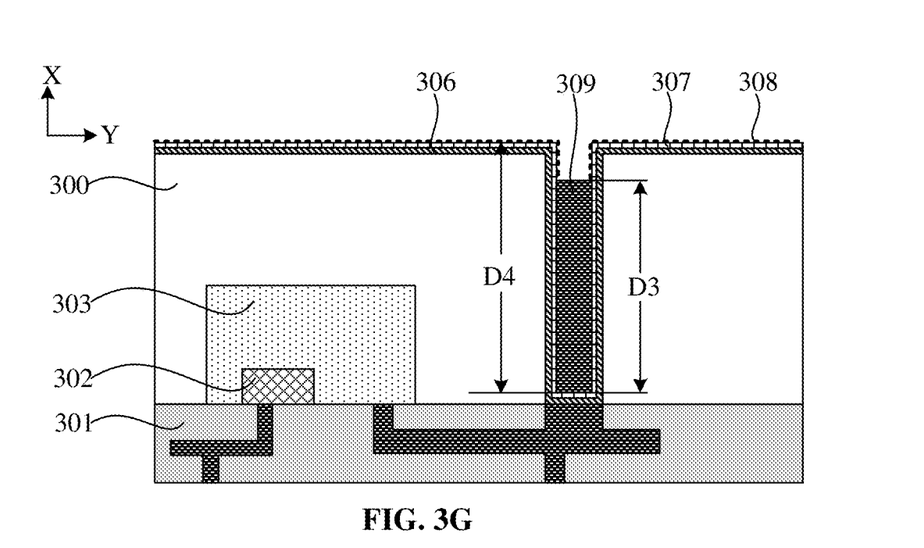
FIG. 3G is a seventh flowchart of forming a micro bump provided in an embodiment of the disclosure.

Then, referring to FIGS. 3E-3G, S202 is executed to form a conductive layer in the TSV.

In some embodiments, before the conductive layer is formed in the TSV, the method for forming the micro bump further includes the following steps.

An insulating material is deposited on an inner wall of the TSV to form an insulating layer.

In the embodiment of the disclosure, the insulating material may be silicon oxide or silicon oxynitride, and the insulating layer is configured to protect the silicon substrate from being damaged. Here, the insulating layer may be formed by any suitable deposition process.

In some embodiments, the silicon substrate may also be oxidized by in-situ oxidation under high temperature and high pressure, to form an insulating layer on the inner wall of the TSV.

As illustrated in FIG. 3E, the insulating layer 306 is formed on both the inner wall of the TSV 305, and the first surface (the surface D) of the silicon substrate 300.

A barrier material is deposited on the surface of the insulating layer to form a barrier layer.

In the embodiment of the disclosure, the barrier material may be metallic tantalum or tantalum nitride, and the barrier layer is configured to prevent the diffusion of the conductive material subsequently filled in the TSV. Here, the barrier layer may be formed by any suitable deposition process.

A seed material is deposited on the surface of the barrier layer to form a seed layer.

In the embodiment of the disclosure, the material of the seed layer may be any conductive material, such as W, Co, Cu, Al or any combination thereof. The seed layer is configured to provide a connecting effect for subsequent formation of the conductive layer in the TSV.

As illustrated in FIG. 3F, the barrier layer 307 is formed on the surface of the insulating layer 306, and the seed layer 308 is formed on the surface of the barrier layer 307.

In some embodiments, forming the conductive layer in the TSV may include the following steps.

At S2021, a conductive material is electroplated on the surface of the seed layer in the TSV by an electrochemical deposition process to form the conductive layer.

In some embodiments, the conductive material includes W, Co, Cu, Al, polysilicon, doped silicon, silicide or any combination thereof, and the conductive material and the seed material may be the same or different. In the embodiment of the disclosure, each of the conductive material forming the conductive layer and seed material is metallic copper.

As illustrated in FIG. 3G, a conductive material is electroplated in the TSV by an electrochemical deposition process to form a conductive layer 309. The conductive layer 309 has a first preset size D3 in the X-axis direction. The first preset size D3 is less than the initial size D4 of the TSV in the X-axis direction, that is, the TSV is not fully filled with the conductive layer 309 in the embodiment of the disclosure.

Figure 3H:
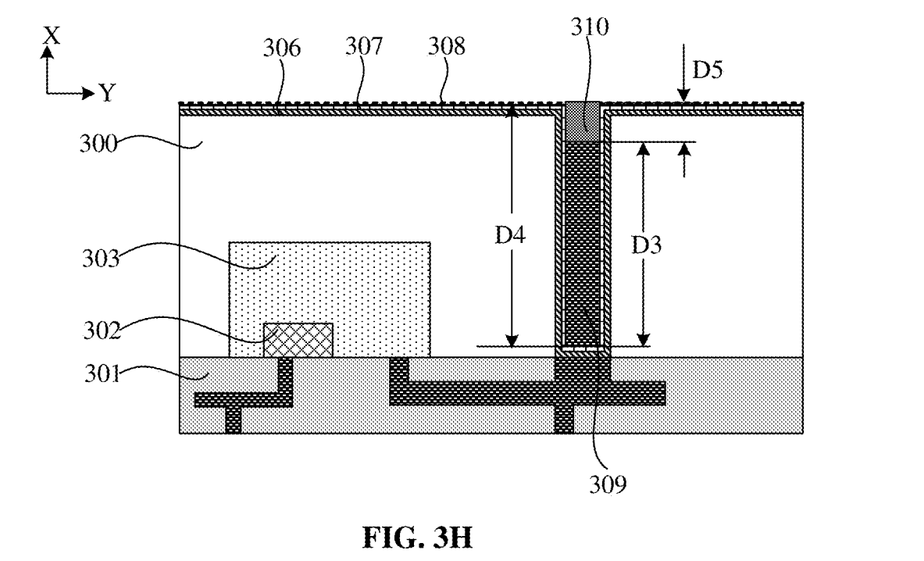
FIG. 3H is an eighth flowchart of forming a micro bump provided in an embodiment of the disclosure.
Figure 3I:
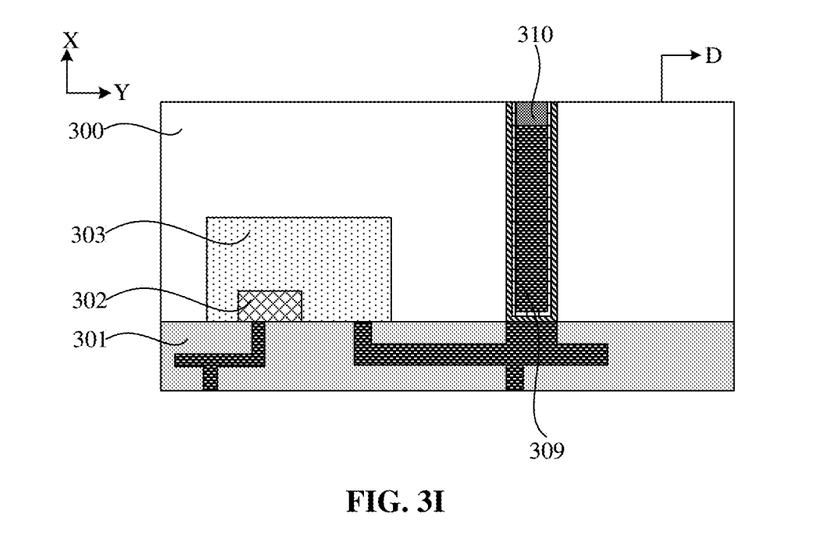
FIG. 3I is a ninth flowchart of forming a micro bump provided in an embodiment of the disclosure.

Then, referring to FIG. 3H and FIG. 3I, S203 is executed to form a connecting layer on the surface of the conductive layer in the TSV.

In some embodiments, forming the connecting layer on the surface of the conductive layer in the TSV includes the following steps.

At S2031, a welding material is deposited on the surface of the conductive layer and the surface of the seed layer in the TSV to form the connecting layer.

In the embodiment of the disclosure, the welding material includes a nickel gold (Ni/Au) conductive material or Solder. Here, the connecting layer may be formed by any suitable deposition process.

As illustrated in FIG. 3H, a welding material is deposited on the surface of the conductive layer 309 and the surface of the seed layer 308 in the TSV to form the connecting layer 310. The connecting layer 310 has a second preset size D5 in the X-axis direction, and a sum of the second preset size D5 and the first preset size D3 is equal to the initial size of the TSV in the X-axis direction.

In some embodiments, when an insulating layer, a barrier layer and a seed layer are formed in the TSV, the insulating layer, the barrier layer and the seed layer are also formed on the first surface of the silicon substrate at the same time. The method for forming the micro bump further includes the following operations.

After the connecting layer is formed, the first surface of the silicon substrate is subjected to chemical mechanical polishing to remove the insulating layer, the barrier layer and the seed layer on the first surface of the silicon substrate.

As illustrated in FIG. 3I, the first surface (the surface D) of the silicon substrate 300 is subjected to chemical mechanical polishing to process the insulating layer, the barrier layer and the seed layer of the first surface of the silicon substrate 300, and expose the first surface of the silicon substrate 300.

Figure 3J:
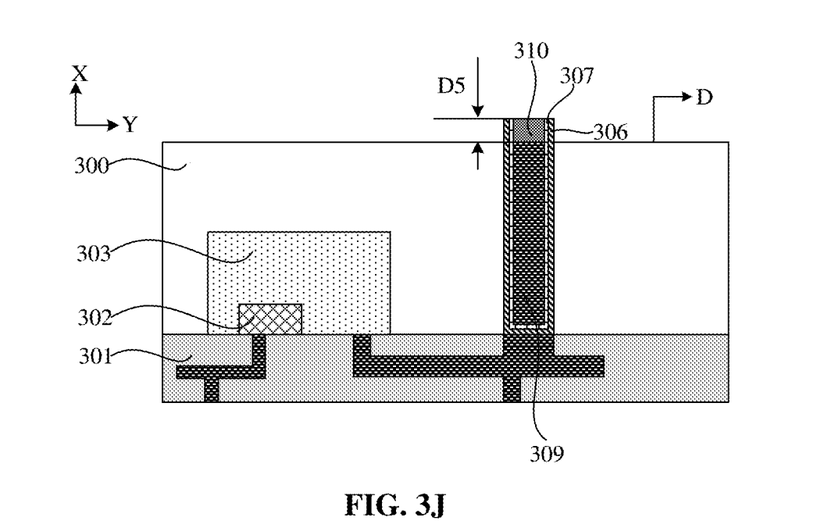
FIG. 3J is a tenth flowchart of forming a micro bump provided in an embodiment of the disclosure.
Figure 3K:
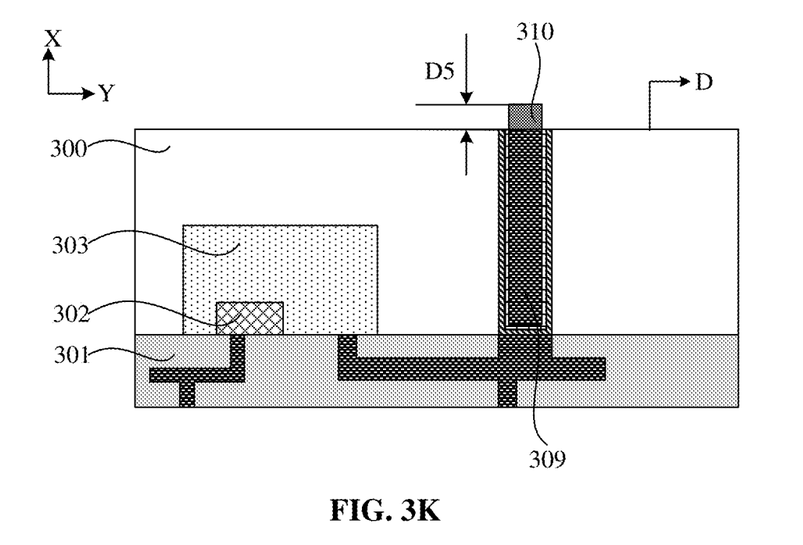
FIG. 3K is an eleventh flowchart of forming a micro bump provided in an embodiment of the disclosure.

Then, referring to FIG. 3J and FIG. 3K, S204 is executed to process the silicon substrate, so as to expose the connecting layer, for forming a micro bump corresponding to the TSV.

In some embodiments, processing the silicon substrate to expose the connecting layer, for forming the micro bump corresponding to the TSV may include the following steps.

At S2041, the silicon substrate with the second preset size is removed by taking the first surface of the silicon substrate as an etching starting point, and the insulating layer, the barrier layer and the seed layer located on the side wall of the connecting layer are retained, so that the connecting layer with the second preset size is exposed, and the micro bump corresponding to the TSV is formed.

As illustrated in FIG. 3*j*, the silicon substrate with the second preset size D5 is etched and removed by a dry etching process by taking the surface D of the silicon substrate 300 as the etching starting point, and the insulating layer 306, the barrier layer 307 and the seed layer located on the side wall of the connecting layer 310 are retained, so that the connecting layer 310 with the second preset size D5 is exposed, and the micro bump corresponding to the TSV is formed.

In the embodiment of the disclosure, the formed micro bump not only includes a connecting layer, but also includes a barrier layer and an insulating layer located on the side wall of the connecting layer. The size of the formed micro bump in the Y-axis direction is equal to the size of the TSV in the Y-axis direction. The insulating layer and the barrier layer may prevent the overflow of the welding material of the connecting layer to a certain extent, to avoid the bridging between the connecting layers.

In some embodiments, processing the silicon substrate to expose the connecting layer, for forming the micro bump corresponding to the TSV may include the following steps.

At S2042, the silicon substrate with the second preset size and the insulating layer, the barrier layer and the seed layer located on the side wall of the connecting layer are removed by taking the first surface of the silicon substrate as an etching starting point, so that the connecting layer with the second preset size is exposed, and the micro bump corresponding to the TSV is formed.

As illustrated in FIG. 3K, by taking the surface D of the silicon substrate 300 as the etching starting point, the silicon substrate with the second preset size D5 is etched and removed by a dry etching process, and the insulating layer, the barrier layer and the seed layer located on the side wall of the connecting layer 310 are etched and removed, so that the connecting layer 310 with the second preset size D5 is exposed, and the micro bump corresponding to the TSV is formed.

In the embodiment of the disclosure, the formed micro bump only includes a connecting layer, does not include a barrier layer and an insulating layer located on the side wall of the connecting layer. The size of the formed micro bump in the Y-axis direction is equal to the size of the conductive layer in the Y-axis direction, and the size of the micro bump in the Y-axis direction is less than the size of the TSV in the Y-axis direction. In the embodiment of the disclosure, the micro bump with small size and small pitch may be manufactured by removing the insulating layer and barrier layer on the side wall of the connecting layer.

In some embodiments, the silicon substrate with the second preset size and the insulating layer, the barrier layer and the seed layer located on the side wall of the connecting layer may be etched and removed at the same time, or the silicon substrate with the second preset size and the insulating layer, the barrier layer and the seed layer located on the side wall of the connecting layer may be removed in sequence.

The embodiment of the disclosure provides a new method for manufacturing a micro bump, which may realize the manufacturing of the micro bump with small size and small pitch, and meet the requirements for Three Dimension (3D) interconnection of bumps with appropriate pitch in the future. As for the micro bump formed by the embodiment of the disclosure, the size of the bump may be controlled below 15 microns, for example, the size of the bump may be 7 microns. The bump pitch may be controlled below 20 microns, for example, the bump pitch may be 10 microns.

In the embodiment of the disclosure, during the implementation of TSV via last, a part of the TSV is filled first, and the remaining part of the TSV is filled with Ni/Au micro bump or solder, then the excess silicon is etched, to expose the micro bump. By the method for forming the micro bump provided in the embodiment of the disclosure, each of the formed micro bump pitch and the bump size may be reduced to various degrees.

The embodiment of the disclosure provides a micro bump, which is formed by the method for forming the micro bump provided in the above embodiment. The micro bump is located in a TSV structure of a chip, and the micro bump is at least configured to implement the interconnection between two chips.

In other embodiments, the micro bump is also configured to implement the interconnection between a chip and a substrate.

Figure 4:
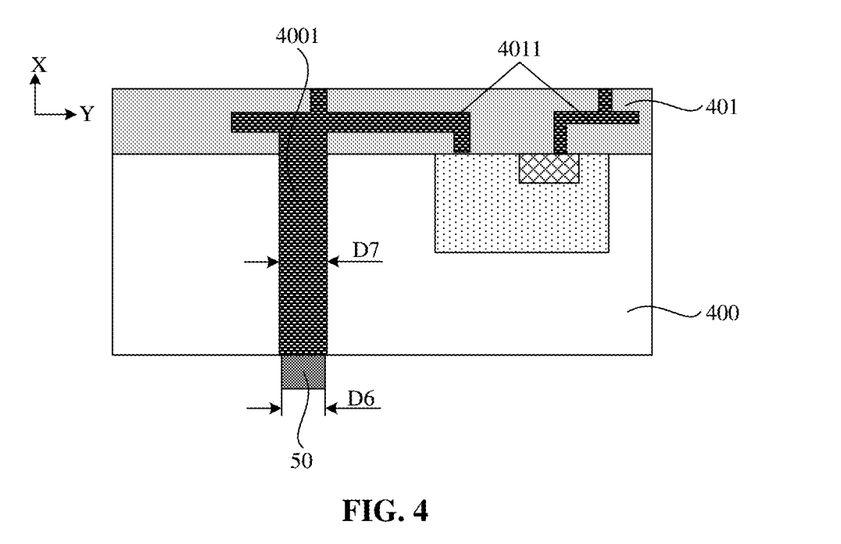
FIG. 4 is an optional schematic structural diagram of a chip and a micro bump provided in an embodiment of the disclosure.

FIG. 4 is an optional schematic structural diagram of a chip and a micro bump provided in an embodiment of the disclosure. As illustrated in FIG. 4, the chip includes a silicon substrate 400 and a dielectric layer 401 located on the surface of the silicon substrate 400. A TSV 4001 is formed in the silicon substrate, and the TSV 4011 corresponds to the micro bump 50. The size D6 of the micro bump 50 in the Y-axis direction is less than the size D7 of the TSV 4001 in the Y-axis direction.

It is to be noted that, FIG. 4 only illustrates one TSV and one micro bump. In the actual manufacturing process, the chip at least may include two TSVs, and a micro bump will be formed corresponding to each TSV.

In the embodiment of the disclosure, the size of the micro bump in the Y-axis direction is less than 15 microns, and the pitch between two adjacent micro bumps is less than 20 microns.

In some embodiments, a metal interconnection wire 4011 connected with a TSV 4001 is also formed in the dielectric layer 401, the TSV 4001 and the metal interconnection wire 4011 are jointly configured to transmit a signal of the first surface of the silicon substrate 400 (i.e., a first surface of the chip) to the second surface of the silicon substrate 400 (i.e., a second surface of the chip), or to transmit a signal of the second surface of the silicon substrate (i.e., the second surface of the chip) to the first surface of the silicon substrate (i.e., the first surface of the chip). The first surface of the silicon substrate and the second surface of the silicon substrate are two opposite surfaces of the silicon substrate along the X-axis direction.

The micro bump provided by the embodiment of the disclosure has small pitch and small size, which may meet the 3D interconnection requirements of a fine pitch bump in the future.

The method for forming the micro bump provided in this embodiment of the disclosure is similar to the method of forming the micro bump in the above embodiment. The technical features not disclosed in detail in the embodiment of the disclosure can be understood with reference to the above embodiment and thus will not be elaborated here.

Figure 5:
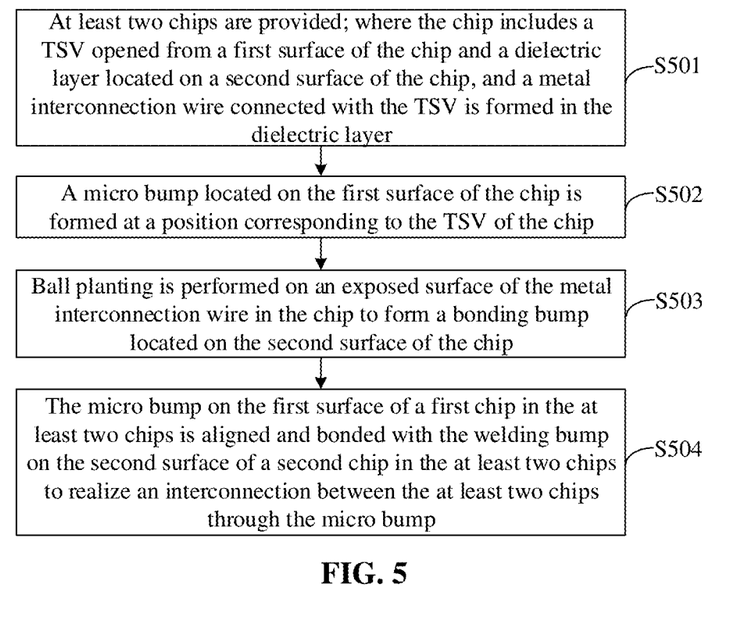
FIG. 5 is an optional schematic flowchart of a chip interconnection method provided in an embodiment of the disclosure.

The embodiment of the disclosure provides a chip interconnection method. FIG. 5 is an optional schematic flowchart of a chip interconnection method provided in an embodiment of the disclosure. As illustrated in FIG. 5, the method includes the following steps.

At S501, at least two chips are provided; the chip includes a TSV opened from a first surface of the chip and a dielectric layer located on a second surface of the chip; a metal interconnection wire connected with the TSV is formed in the dielectric layer; and the first surface and the second surface are two opposite surfaces of the chip in the thickness direction of the chip.

In the embodiment of the disclosure, the chip is a chip to be packaged. The chip includes a silicon substrate and a dielectric layer, and the TSV is formed in the silicon substrate and penetrates through the silicon substrate. A metal interconnection wire is formed in the dielectric layer, and is connected with the TSV, and the TSV and the metal interconnection are jointly configured to transmit a signal of the first surface of the chip to the second surface of the chip.

At S502, a micro bump located on the first surface of the chip is formed at a position corresponding to the TSV of the chip.

The micro bump is formed by the method of forming the micro bump provided in the above embodiment. The technical features not disclosed in detail in the embodiment of the disclosure can be understood with reference to the above embodiment.

In the embodiment of the disclosure, the chip includes at least two TSVs, and a micro bump is formed at a position corresponding to each TSV.

At S503, ball planting is performed on an exposed surface of the metal interconnection wire in the chip to form a bonding bump located on the second surface of the chip.

In some embodiments, the metal interconnection wire is also configured to lead out a signal of the second surface of the chip. The bonding bump is also configured to realize stacking between chips and stacking between a chip and a substrate. Here, the size of the bonding bump is greater than that of the micro bump.

At S504, the micro bump on the first surface of a first chip in the at least two chips is aligned and bonded with the welding bump on the second surface of a second chip in the at least two chips to realize the interconnection between the at least two chips through the micro bump.

In the embodiment of the disclosure, the interconnection between the chips is of back-to-face welding type, that is, the first surface of the first chip in at least two chips is in contact with the second surface of the second chip in at least two chips. The interconnection between the chips is realized through the alignment and bonding between the micro bump and the welding bump.

According to the chip interconnection method provided in the embodiment of the disclosure, since the micro bump formed on the first surface of the chip may realize small size and small pitch, it can meet the requirements of 3D interconnection in the future.

Figure 6:
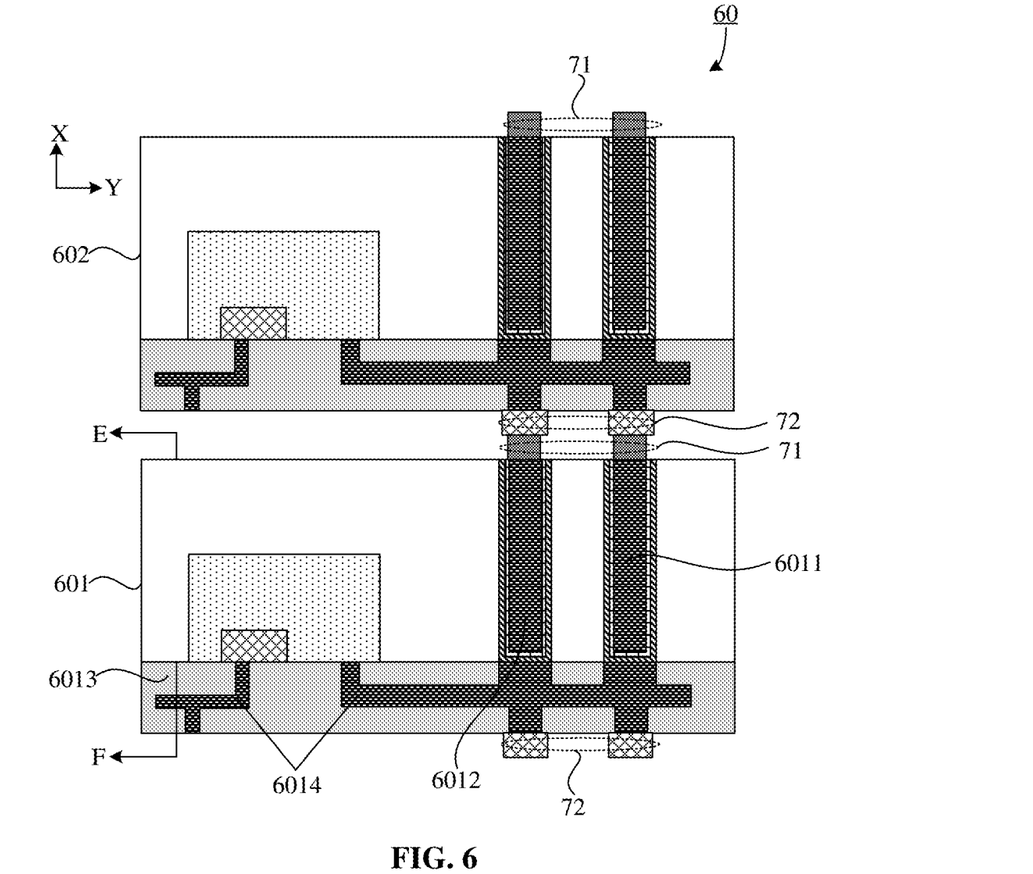
FIG. 6 is an optional schematic structural diagram of a chip interconnection structure provided in an embodiment of the disclosure.

The embodiment of the disclosure further provides a chip interconnection structure. The chip interconnection structure includes at least two chips, a micro bump located on a first surface of each chip and a bonding bump located on a second surface of each chip. FIG. 6 is an optional schematic structural diagram of a chip interconnection structure provided in an embodiment of the disclosure. As illustrated in FIG. 6, in the embodiment of the disclosure, the chip interconnection structure 60 includes two stacked chips 601 and 602, a micro bump 71 located on a first surface of each chip and a bonding bump 72 located on a second surface of each chip.

In the embodiment of the disclosure, the structure of each chip in the chip interconnection structure is the same. The chip 601 is taken as an example to introduce the internal structure of the chip below.

Also referring to FIG. 6, the chip 601 includes TSVs 6011 and 6012 opened from the first surface of the chip (such as a surface E illustrated in FIG. 6) and a dielectric layer 6013 located on the second surface of the chip (such as a surface F illustrated in FIG. 6). A metal interconnection wire 6014 connected with each of the TSVs 6011 and 6012 is formed in the dielectric layer 6013. The first surface (the surface E) and the second surface (the surface F) are two opposite surfaces of the chip 601 in the X-axis direction.

In the embodiment of the disclosure, the micro bump of each chip is connected with the TSV, and the micro bump is formed by the method for forming the micro bump provided by the above embodiment. The bonding bump of each chip is connected with the metal interconnection wire. The micro bump on the first surface of the first chip of the at least two chips is electrically connected with the welding bump on the second surface of the second chip of the at least two chips.

It is to be noted that, in the embodiment of the disclosure, FIG. 6 only illustrates two TSVs and two micro bumps. In the actual process, there may be a plurality of TSVs in the chip, and a micro bump may be formed at the position of each TSV.

The chip interconnection structure provided in this embodiment of the disclosure is similar to that in the above embodiment. The technical features not disclosed in detail in the embodiment of the disclosure can be understood with reference to the above embodiment and thus will not be elaborated here.

According to the chip interconnection structure provided in the embodiment of the disclosure, since the micro bump formed on the first surface of the chip may realize small size and small pitch, it can meet the requirements of 3D interconnection in the future.

In several embodiments provided in the disclosure, it should be understood that, the disclosed devices and methods may be implemented in a non-target manner. The device embodiment described above is only schematic, and for example, division of the units is only logic function division, and other division manners may be adopted during practical implementation. For example, a plurality of units or components may be combined or integrated into another system, or some characteristics may be neglected or not implemented. In addition, the components shown or discussed are coupled or directly coupled to each other.

The above-mentioned units described as separate parts may be or may not be physically separated. The parts shown as units may be or may not be physical elements, which may be located in one place or distributed to a plurality of network elements. Part or all of the units may be selected to achieve the objectives of the solutions of the embodiments according to practical requirements.

The features disclosed in several methods or device embodiments provided by the disclosure may be combined arbitrarily without conflict to obtain new method embodiments or device embodiments.

The above embodiments are only some implementation mode of the disclosure and not intended to limit the scope of protection of the disclosure. Modifications or replacements are apparent to those skilled in the art within the technical scope disclosed by the embodiment of the disclosure, and these modifications or replacements shall fall within the scope of protection of the disclosure. Therefore, the scope of protection of the disclosure should be subject to the appended claims.

What is claimed is:

1. A method for forming a micro bump, comprising:
providing a chip at least comprising a silicon substrate and a through silicon via penetrating through the silicon substrate;
forming a conductive layer in the through silicon via, wherein the conductive layer has a first preset size in a first direction, and the first direction is a thickness direction of the silicon substrate;
forming a connecting layer on a surface of the conductive layer in the through silicon via, wherein the connecting layer has a second preset size in the first direction, and a sum of the first preset size and the second preset size is equal to an initial size of the through silicon via in the first direction; and
processing the silicon substrate to expose the connecting layer, for forming a micro bump corresponding to the through silicon via;
before forming the conductive layer, further comprising:
depositing an insulating material on an inner wall of the through silicon via to form an insulating layer;
depositing a barrier material on a surface of the insulating layer to form a barrier layer; and
depositing a seed material on a surface of the barrier layer to form a seed layer; wherein
the insulating layer, the barrier layer and the seed layer are formed on the first surface of the silicon substrate; and
the method further comprises:
performing a chemical mechanical polishing on the first surface of the silicon substrate after the connecting layer is formed, to remove the insulating layer, the barrier layer and the seed layer on the first surface of the silicon substrate;
processing the silicon substrate to expose the connecting layer, for forming the micro bump corresponding to the through silicon via comprises:
removing the silicon substrate with the second preset size by taking the first surface of the silicon substrate as an etching starting point, and retaining the insulating layer, the barrier layer and the seed layer located on a side wall of the connecting layer, to expose the connecting layer with the second preset size, for forming the micro bump corresponding to the through silicon via.

2. The method according to claim 1, wherein forming the conductive layer in the through silicon via comprises:
   electroplating a conductive material on a surface of the seed layer in the through silicon via by an electrochemical deposition process to form the conductive layer,
   wherein the conductive material is the same as the seed material.

3. The method according to claim 1, wherein forming the connecting layer on the surface of the conductive layer in the through silicon via comprises:
   depositing a welding material on a surface of each of the conductive layer and the seed layer in the through silicon via to form the connecting layer,
   wherein the welding material comprises a nickel gold conductive material or solder.

4. The method according to claim 1, wherein processing the silicon substrate to expose the connecting layer, for forming the micro bump corresponding to the through silicon via comprises:
   removing the silicon substrate with the second preset size and the insulating layer, the barrier layer and the seed layer located on the side wall of the connecting layer by taking the surface of the silicon substrate as an etching starting point, to expose the connecting layer with the second preset size, for forming the micro bump corresponding to the through silicon via.

5. The method according to claim 1, wherein providing the chip comprises:
   providing the silicon substrate; and
   etching the silicon substrate to form the through silicon via penetrating through the silicon substrate by taking the first surface of the silicon substrate as an etching starting point,
   wherein a size of the through silicon via in a second direction is less than 15 microns, a pitch between two adjacent through silicon vias is less than 20 microns, and the second direction is perpendicular to the first direction.

6. The method according to claim 5, wherein forming the through silicon via penetrating through the silicon substrate comprises:
   forming a first photoresist layer on the first surface of the silicon substrate;
   patterning the first photoresist layer to form a window that exposes the first surface of the silicon substrate; and
   etching the silicon substrate through the window to form the through silicon via penetrating through the silicon substrate.

7. The method according to claim 1, wherein the chip further comprises:
   a dielectric layer located on a second surface of the silicon substrate; a metal interconnection wire connected with the through silicon via is formed in the dielectric layer;
   the first surface of the silicon substrate and the second surface of the silicon substrate are two opposite surfaces of the silicon substrate in the first direction;
   the through silicon via and the metal interconnection wire are jointly configured to transmit a signal of the first surface of the silicon substrate to the second surface of the silicon substrate.

8. The method according to claim 7, wherein the metal interconnection wire located in the dielectric layer is formed in the following manner of:
   depositing a dielectric material on the second surface of the silicon substrate to form the dielectric layer;
   forming a patterned second photoresist layer on a surface of the dielectric layer;
   etching the dielectric layer through the second photoresist layer to form an interconnection hole located in the dielectric layer; and
   filling the interconnection hole with a conductive material to form the metal interconnection wire located in the dielectric layer.

9. The method according to claim 7, wherein the chip further comprises a welding pad located on the second surface of the silicon substrate;
   a first end of the welding pad is connected with an internal circuit of the chip, a second end of the welding pad is connected with the metal interconnection wire in the dielectric layer, and the metal interconnection wire is further configured to lead out a signal of the second surface of the silicon substrate.

10. A micro bump, formed by a method for forming the micro bump, the method comprising:
   providing a chip at least comprising a silicon substrate and a through silicon via penetrating through the silicon substrate;
   forming a conductive layer in the through silicon via, wherein the conductive layer has a first preset size in a first direction, and the first direction is a thickness direction of the silicon substrate;
   forming a connecting layer on a surface of the conductive layer in the through silicon via, wherein the connecting layer has a second preset size in the first direction, and a sum of the first preset size and the second preset size is equal to an initial size of the through silicon via in the first direction; and
   processing the silicon substrate to expose the connecting layer, for forming a micro bump corresponding to the through silicon via;
   before forming the conductive layer, further comprising:
   depositing an insulating material on an inner wall of the through silicon via to form an insulating layer;
   depositing a barrier material on a surface of the insulating layer to form a barrier layer; and
   depositing a seed material on a surface of the barrier layer to form a seed layer;
   wherein
   the insulating layer, the barrier layer and the seed layer are formed on the first surface of the silicon substrate; and
   the method further comprises:
   performing a chemical mechanical polishing on the first surface of the silicon substrate after the connecting layer is formed, to remove the insulating layer, the barrier layer and the seed layer on the first surface of the silicon substrate;
   said processing the silicon substrate to expose the connecting layer, for forming the micro bump corresponding to the through silicon via comprises:
   removing the silicon substrate with the second preset size by taking the first surface of the silicon substrate as an etching starting point, and retaining the insulating layer, the barrier layer and the seed layer located on a side wall of the connecting layer, to expose the connecting layer with the second preset size, for forming the micro bump corresponding to the through silicon via;

wherein the micro bump is located in the through silicon via of the chip, and the micro bump is at least configured to implement an interconnection between two chips.

11. The micro bump according to claim 10, wherein the chip comprises a through silicon via penetrating through the silicon substrate of the chip;

the through silicon via corresponds to the micro bump, and a size of the micro bump in a direction perpendicular to a first direction is less than a size of the through silicon via in the direction perpendicular to the first direction.

12. The micro bump according to claim 11, wherein a size of the micro bump in a second direction is less than 15 microns, and a pitch between two adjacent micro bumps is less than 20 microns, and wherein the second direction is perpendicular to the first direction.

13. A chip interconnection structure, comprising:

at least two chips, wherein the chip comprises a through silicon via opened from a first surface of the chip and a dielectric layer located on a second surface of the chip; a metal interconnection wire connected with the through silicon via is formed in the dielectric layer; the first surface and the second surface are two opposite surfaces of the chip in a thickness direction of the chip;

a micro bump located on the first surface of the chip, wherein the micro bump is connected with the through silicon via; and the micro bump is formed by a method for forming the micro bump comprising providing the chip at least comprising a silicon substrate and the through silicon via penetrating through the silicon substrate;

forming a conductive layer in the through silicon via, wherein the conductive layer has a first preset size in a first direction, and the first direction is a thickness direction of the silicon substrate;

forming a connecting layer on a surface of the conductive layer in the through silicon via, wherein the connecting layer has a second preset size in the first direction, and a sum of the first preset size and the second preset size is equal to an initial size of the through silicon via in the first direction; and processing the silicon substrate to expose the connecting layer, for forming the micro bump corresponding to the through silicon via;

before forming the conductive layer, further comprising:

depositing an insulating material on an inner wall of the through silicon via to form an insulating layer;

depositing a barrier material on a surface of the insulating layer to form a barrier layer; and depositing a seed material on a surface of the barrier layer to form a seed layer;

wherein the insulating layer, the barrier layer and the seed layer are formed on the first surface of the silicon substrate; and the method further comprises:

performing a chemical mechanical polishing on the first surface of the silicon substrate after the connecting layer is formed, to remove the insulating layer, the barrier layer and the seed layer on the first surface of the silicon substrate;

said processing the silicon substrate to expose the connecting layer, for forming the micro bump corresponding to the through silicon via comprises:

removing the silicon substrate with the second preset size by taking the first surface of the silicon substrate as an etching starting point, and retaining the insulating layer, the barrier layer and the seed layer located on a side wall of the connecting layer, to expose the connecting layer with the second preset size, for forming the micro bump corresponding to the through silicon via;

a bonding bump located on the second surface of the chip, wherein the bonding bump is connected with the metal interconnection wire; and wherein the micro bump on the first surface of a first chip in the at least two chips is electrically connected with the welding bump on the second surface of a second chip in the at least two chips.

* * * * *